United States Patent
Wu et al.

(10) Patent No.: US 9,318,322 B2
(45) Date of Patent: Apr. 19, 2016

(54) FINFET DESIGN CONTROLLING CHANNEL THICKNESS

(71) Applicant: Taiwan Semiconductor Manufacturing Company, Ltd., Hsin-Chu (TW)

(72) Inventors: Zhiqiang Wu, Chubei (TW); Ken-Ichi Goto, Hsin-Chu (TW); Wen-Hsing Hsieh, Taichung (TW); Jon-Hsu Ho, New Taipei (TW); Chih-Ching Wang, Jinhu Township (TW); Ching-Fang Huang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/541,050

(22) Filed: Nov. 13, 2014

(65) Prior Publication Data
US 2015/0079752 A1 Mar. 19, 2015

Related U.S. Application Data

(62) Division of application No. 13/335,689, filed on Dec. 22, 2011, now Pat. No. 8,890,207.

(60) Provisional application No. 61/531,488, filed on Sep. 6, 2011.

(51) Int. Cl.
  *H01L 21/336* (2006.01)
  *H01L 29/78* (2006.01)
  *H01L 29/36* (2006.01)
  *H01L 21/02* (2006.01)
  (Continued)

(52) U.S. Cl.
CPC ...... *H01L 21/02362* (2013.01); *H01L 21/0234* (2013.01); *H01L 21/02123* (2013.01); *H01L 21/02293* (2013.01); *H01L 29/1054* (2013.01); *H01L 29/66795* (2013.01); *H01L 29/785* (2013.01)

(58) Field of Classification Search
CPC .............. H01L 21/0234; H01L 21/02362; H01L 21/02123; H01L 21/02293; H01L 29/7783; H01L 29/66795
USPC ............ 438/157, 197, 283, 289; 257/24, 183, 257/190, 191, 287, 369, 655, E21.09, 257/E21.206, E21.209, E21.702, E29.068, 257/E29.109, E29.255
See application file for complete search history.

(56) References Cited

U.S. PATENT DOCUMENTS 7,202,517 B2 * 4/2007 Dixit et al. ............ 257/287
7,928,426 B2 * 4/2011 Chui et al. ............. 257/24
8,890,207 B2 * 11/2014 Wu et al. ............... 257/191
(Continued)

FOREIGN PATENT DOCUMENTS

CN 101960570 A 1/2011
JP 2011071517 A 4/2011
(Continued)

*Primary Examiner* — Dao H Nguyen
(74) *Attorney, Agent, or Firm* — Slater & Matsil, L.L.P.

(57) ABSTRACT

System and method for controlling the channel thickness and preventing variations due to formation of small features. An embodiment comprises a fin raised above the substrate and a capping layer is formed over the fin. The channel carriers are repelled from the heavily doped fin and confined within the capping layer. This forms a thin-channel that allows greater electrostatic control of the gate.

20 Claims, 14 Drawing Sheets

Y-Z plane view

(51) Int. Cl.
   *H01L 29/66*   (2006.01)
   *H01L 29/10*   (2006.01)

(56) References Cited

U.S. PATENT DOCUMENTS

| | | | |
|---|---|---|---|
| 8,927,371 B2 * | 1/2015 | Ko et al. | 438/283 |
| 2005/0051812 A1 | 3/2005 | Dixit et al. | |
| 2007/0069302 A1 | 3/2007 | Jin et al. | |
| 2010/0301390 A1 | 12/2010 | Ko et al. | |
| 2011/0018065 A1 * | 1/2011 | Curatola et al. | 257/368 |
| 2011/0068407 A1 | 3/2011 | Yeh et al. | |
| 2012/0074386 A1 * | 3/2012 | Rachmady et al. | 257/24 |
| 2014/0353715 A1 * | 12/2014 | Xiao | 257/190 |
| 2015/0200285 A1 * | 7/2015 | Cho et al. | 257/24 |

FOREIGN PATENT DOCUMENTS

| | | |
|---|---|---|
| KR | 20090125148 A | 12/2008 |
| KR | 20100129146 A | 12/2010 |
| KR | 20110078507 A | 7/2011 |
| WO | 2008118825 A1 | 10/2008 |

* cited by examiner

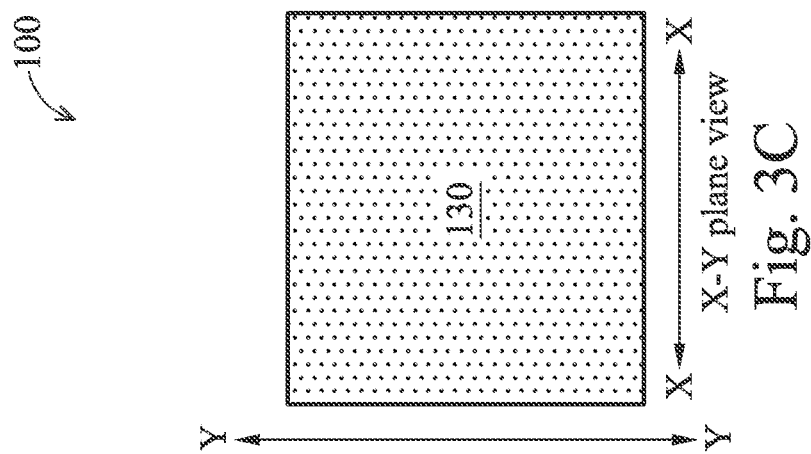
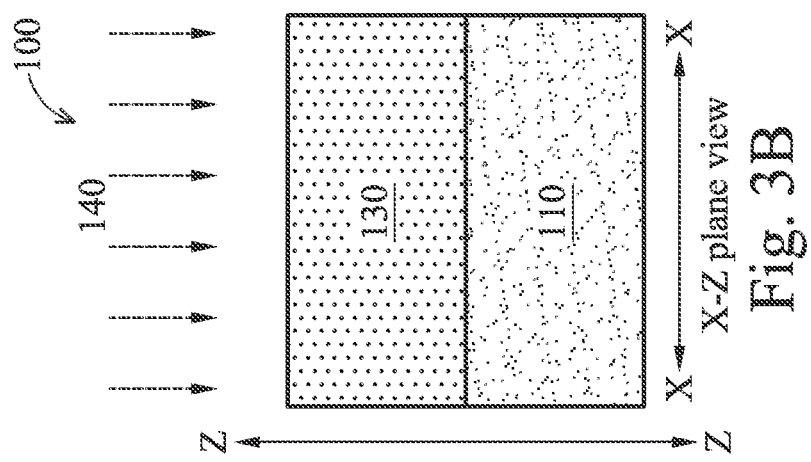
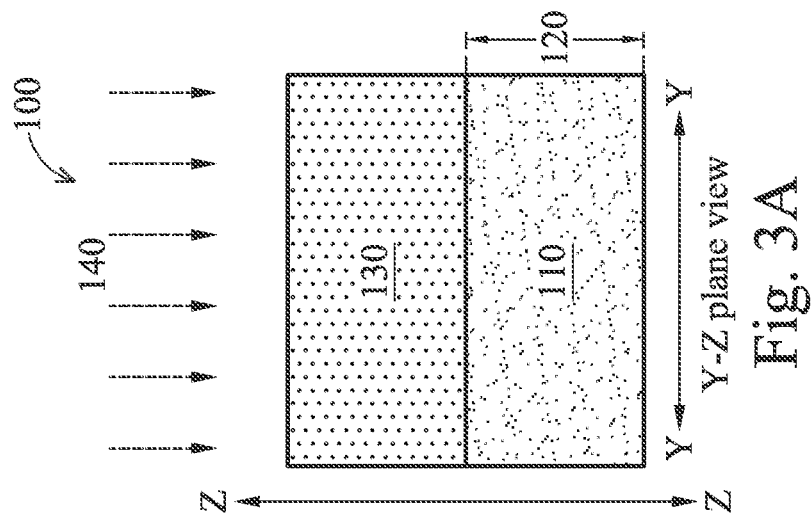

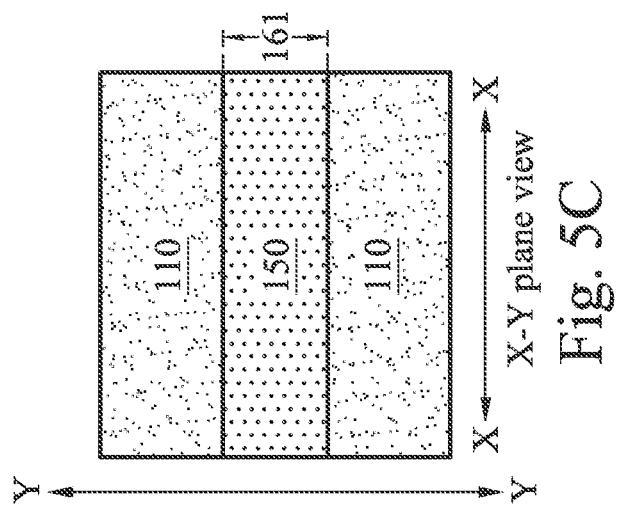
Fig. 5C X-Y plane view
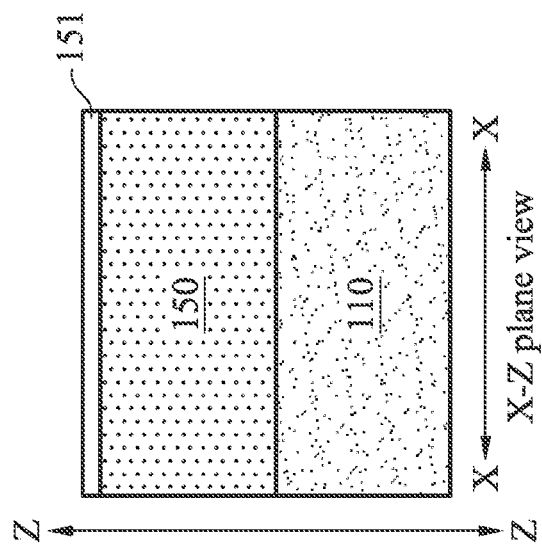
Fig. 5B X-Z plane view
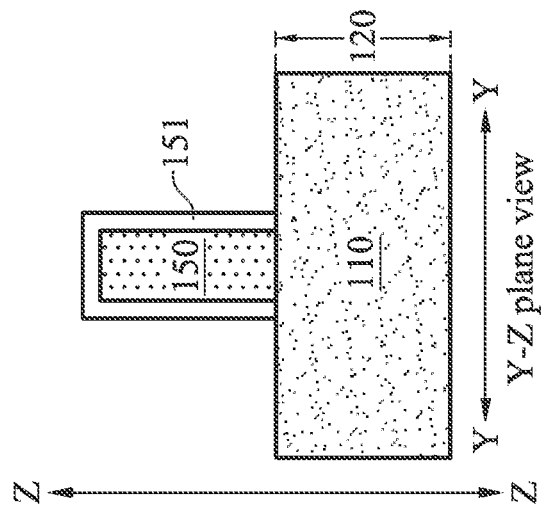
Fig. 5A Y-Z plane view

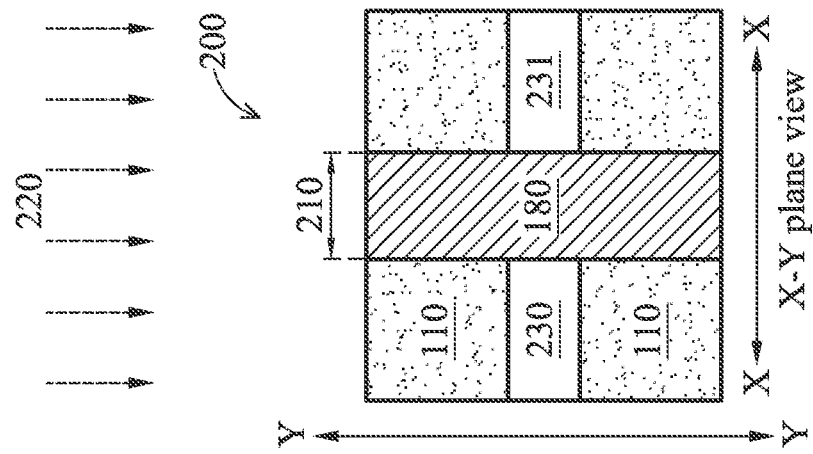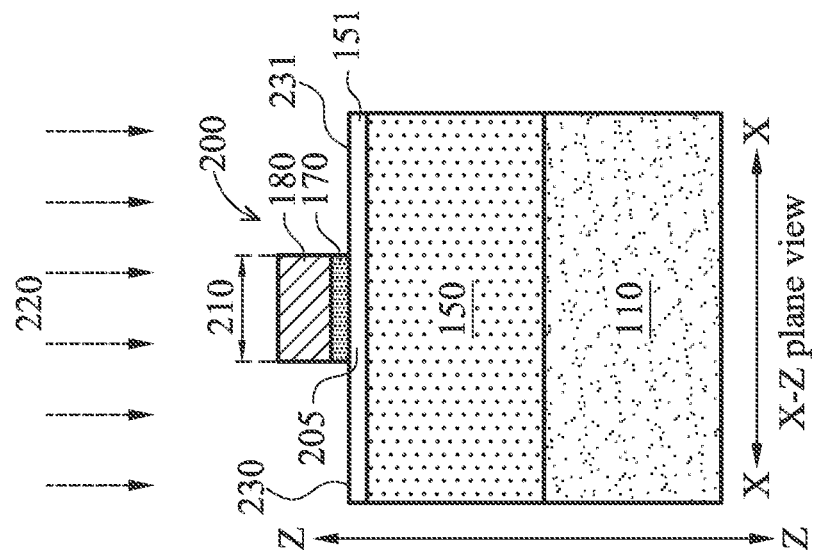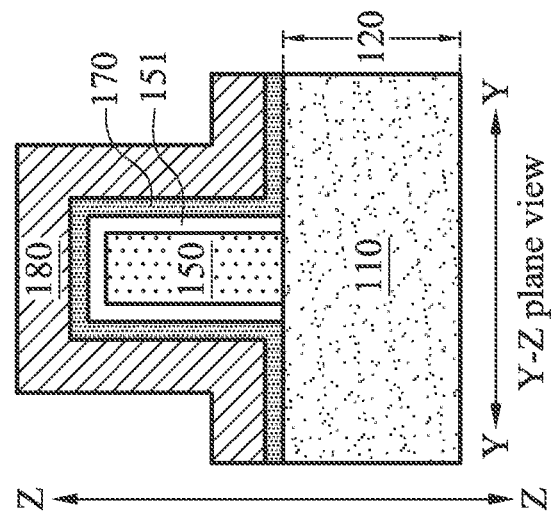
Fig. 7C
Fig. 7B
Fig. 7A

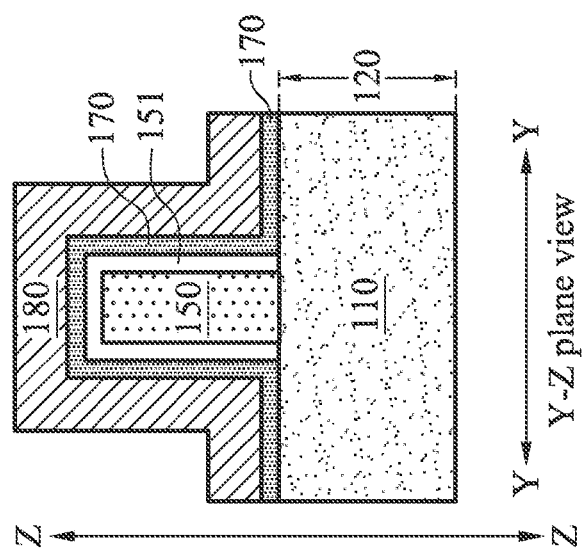
Fig. 8A Y-Z plane view
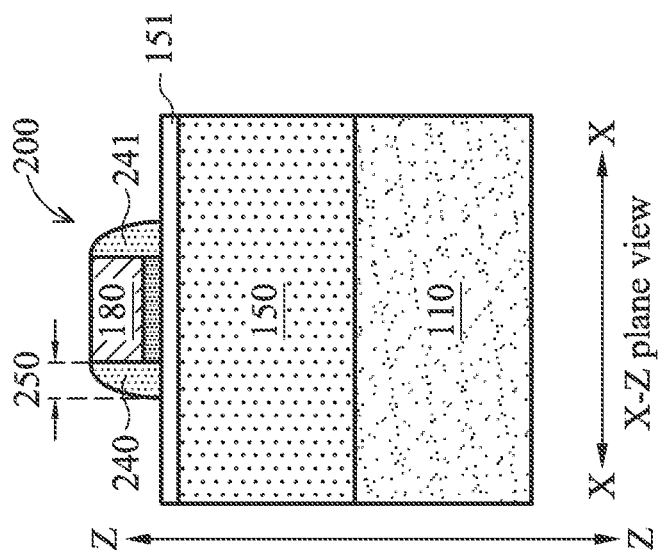
Fig. 8B X-Z plane view
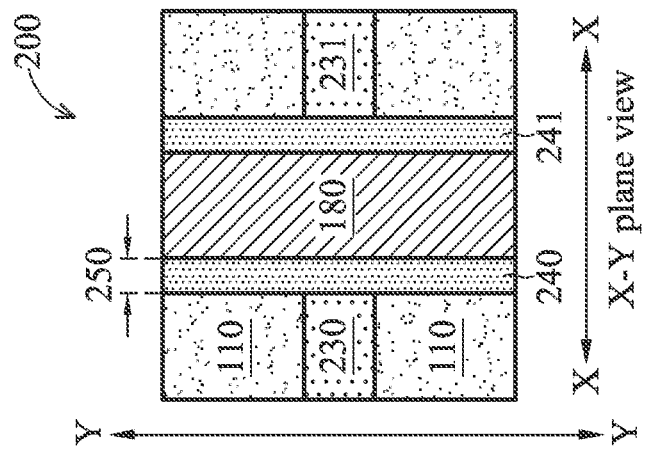
Fig. 8C X-Y plane view

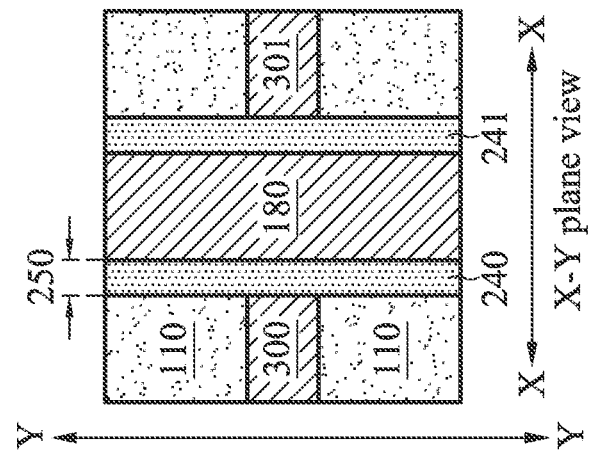
Fig. 10C X-Y plane view
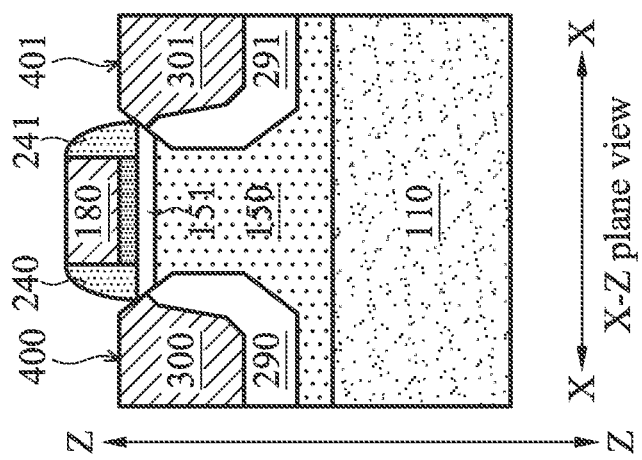
Fig. 10B X-Z plane view
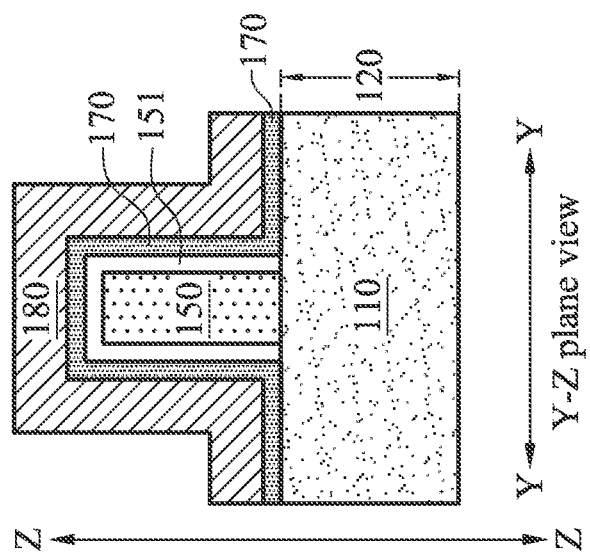
Fig. 10A Y-Z plane view

US 9,318,322 B2

FINFET DESIGN CONTROLLING CHANNEL THICKNESS

This application is a divisional of, and claims the benefit of, U.S. patent application Ser. No. 13/335,689, filed on Dec. 22, 2011, titled "FinFET Design Controlling Channel Thickness," which application claims the benefit of U.S. Provisional Patent Application No. 61/531,488, filed on Sep. 6, 2011, and entitled "Transistor Structure with Improved Electrical Characteristics and Reduced Variability," which applications are hereby incorporated by reference.

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing the sizes of semiconductor devices. Fin field-effect transistors (FinFET) were thus developed.

The introduction of FinFETs has the advantageous feature of increasing drive current without the cost of occupying more chip area. However, even though FinFETs have improved short-channel effects (SCE) compared to planar transistors in occupying the same chip are, FinFETs still suffer from SCE. To help control SCE in FinFETs, the fin width of FinFETs is typically narrow. This presents processing and formation difficulties to form such small features. Also in a narrow fin design, the fin is fully or mostly depleted and this diminishes the control of the threshold voltage through substrate bias.

Accordingly, what is needed in the art is a semiconductor device that may incorporate FinFETs thereof to take advantage of the benefits with increased drive currents without increasing the chip area usage while at the same time overcoming the deficiencies of the prior art.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 3A through 11C are cross-sectional views of intermediate stages in the manufacturing of a FinFET in accordance with an embodiment;

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

A novel fin field-effect transistor (FinFET) and the method of forming the same are presented. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 1:
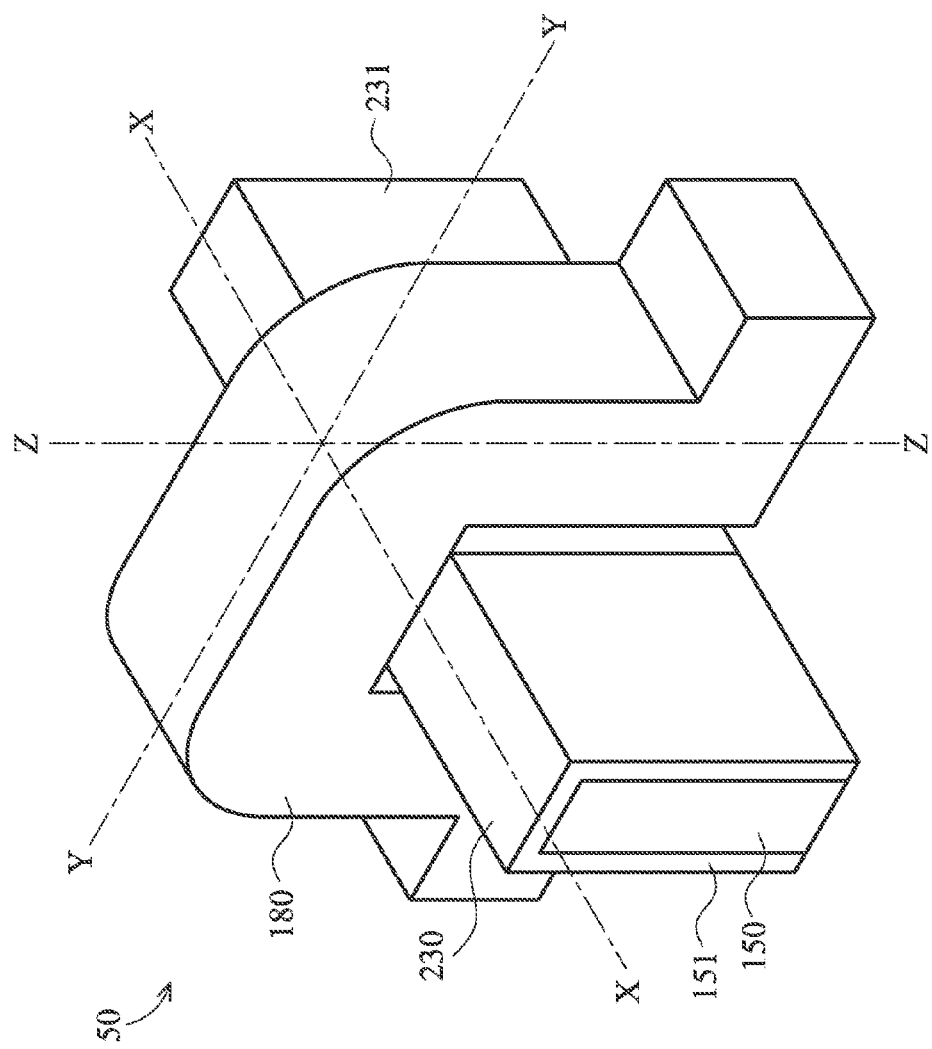
FIG. 1 is a perspective view of a FinFET in accordance with an embodiment.

FIG. 1 illustrates a perspective view of FinFET 50, which includes a fin 150, a first capping layer 151, a gate 180, a source region 230, and a drain region 231. The fin 150 is formed as a vertical silicon fin extending above a substrate (not shown), and is used to form the source region 230, the drain region 231, and a channel region (not shown) between the source and drain regions. A first capping layer 151 is formed around the fin 150 followed by a gate dielectric layer (not shown) in the channel region. The gate 180 is then formed around the fin and wraps the fin in the channel region. The source region 230 and the drain region 231 are doped to make these portions of fin 150 conductive. In another embodiment, the source region 230 and the drain region 231 could be formed by first forming recesses (discussed in detail in reference to FIGS. 9A through 9C) and then epitaxially growing the source and drain regions by selective epitaxial growth (SEG) (discussed in detail in reference to FIGS. 10A through 10C). In another embodiment, non-selective epitaxial growth could be employed. The regions may be doped either through an implantation method as discussed below, or else by in-situ doping as the material is grown.

Figure 2:
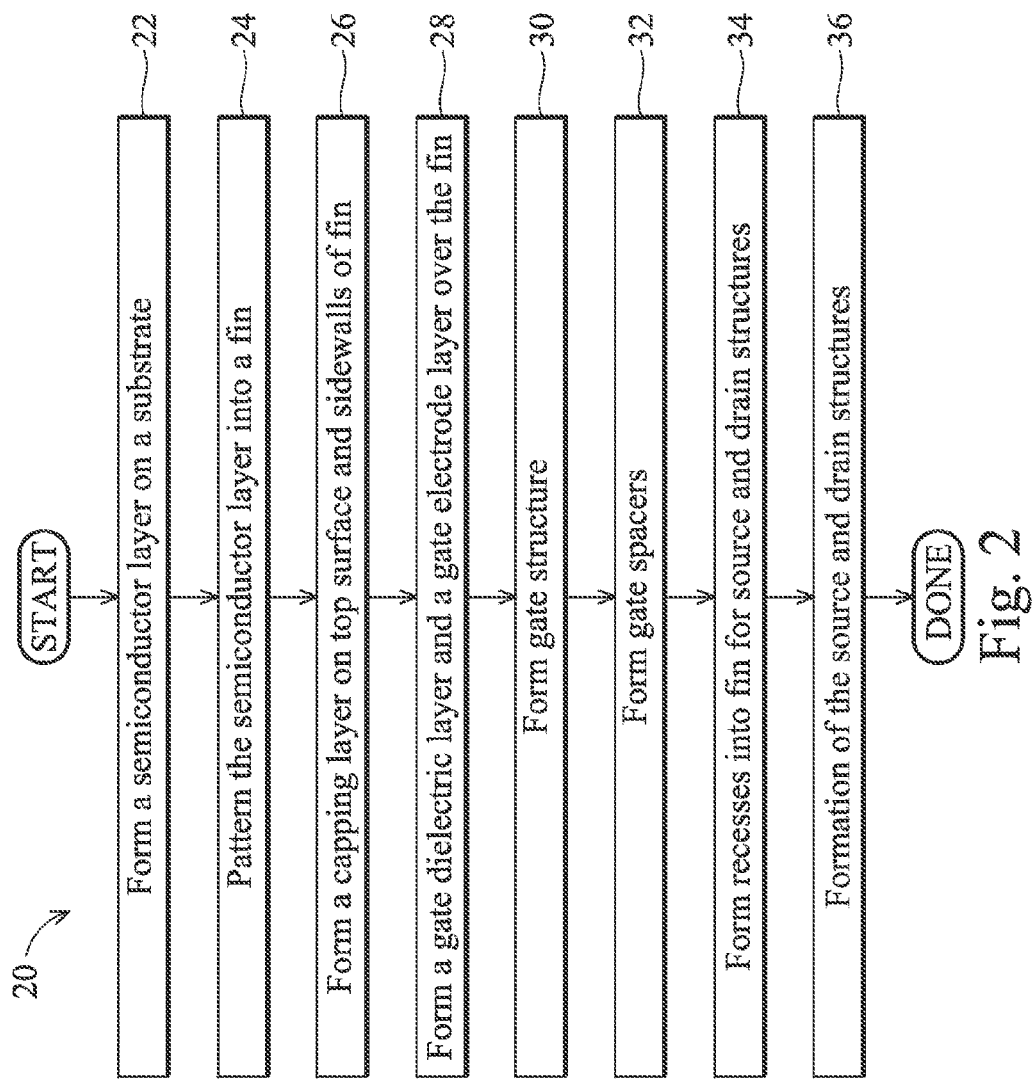
FIG. 2 is a flow chart showing a method of forming a FinFET in accordance with an embodiment.

A method 20 of forming a fin type multiple-gate transistor is illustrated using the flow chart of FIG. 2. Cross-sectional views of the multiple-gate transistor during the various process steps described in FIG. 2 are illustrated in FIGS. 3A through 10C.

Step 22 is the formation of a semiconductor layer on a substrate as shown in FIGS. 3A, 3B, and 3C. FIG. 3A is from the Z plane along the line Y-Y, FIG. 3B is from the Z plane along the line X-X, and FIG. 3C is from the Y plane along the line X-X of FIG. 1.

With reference to FIGS. 3A, 3B, and 3C, there is shown a semiconductor layer 130 on a base substrate 110. The semiconductor layer 130 may comprise bulk silicon or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. The semiconductor layer 130 may be formed from an elemental semiconductor such as silicon, an alloy semiconductor such as silicon-germanium, or a compound semiconductor such as gallium arsenide or indium phosphide. In an embodiment, the semiconductor layer 130 is silicon. The semiconductor layer 130 may then doped through an implantation process 140 to introduce p-type or n-type impurities into the semiconductor layer 130. According to an embodiment, boron or boron difluoride ions may be used to introduce p-type impurities and arsenic or phosphorous ions may be used to introduce n-type impurities at a level from $1e^{17}$ ions/$cm^3$ to $5e^{19}$ ions/$cm^3$.

Figure 4C:
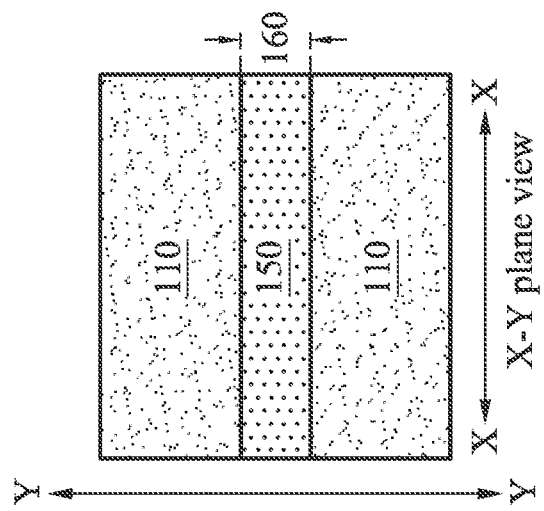
Figure 4B:
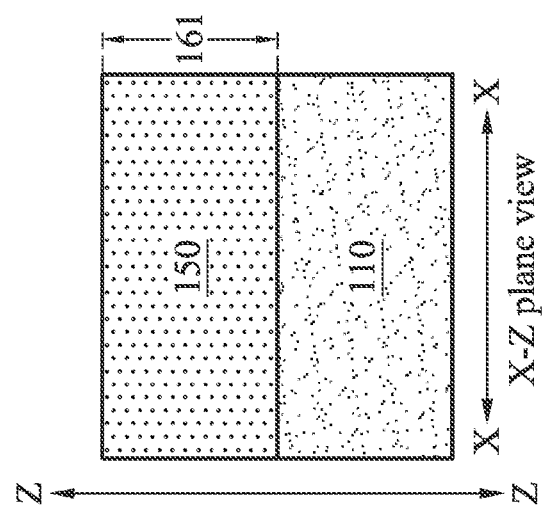
Figure 4A:
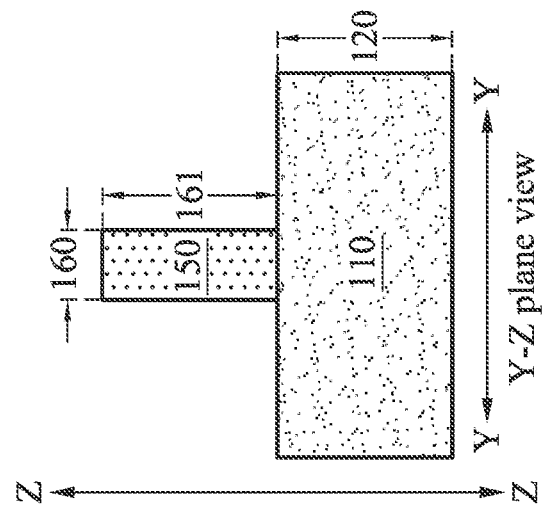

Step 24 is the patterning of the semiconductor layer into a fin as shown in FIGS. 4A, 4B, and 4C. FIG. 4A is from the Z plane along the line Y-Y, FIG. 4B is from the Z plane along the line X-X, and FIG. 4C is from the Y plane along the line X-X of FIG. 1.

With reference to FIGS. 4A, 4B, and 4C, the fin 150 is formed by patterning the semiconductor layer 130. The fin patterning process may be accomplished by depositing a commonly used mask material (not shown) such as photoresist or silicon oxide over the semiconductor layer 130. The mask material is then patterned and the semiconductor layer is etched in accordance with the pattern. In this manner, a semiconductor structure of a semiconductor fin overlying a substrate may be formed. As illustrated in FIGS. 4B and 4C, the fin 150 extends along the line X-X of FIG. 1. In an alternative embodiment, fin 150 may be epitaxially grown from a top surface of substrate 110 within trenches or openings formed in a patterned layer atop substrate 110. Because the process is known in the art, the details are not repeated herein. In an embodiment, as shown in FIGS. 4A and 4C, the fin 150 may have a width 160 of between approximately 2 nm and 20 nm and as shown in FIGS. 4A and 4B the fin may have a height 161 of between 7 nm and 50 nm.

Step 26 is the formation of a capping layer on the top surface and sidewalls of the fin as shown in FIGS. 5A, 5B, and 5C. FIG. 5A is from the Z plane along the line Y-Y, FIG. 5B is from the Z plane along the line X-X, and FIG. 5C is from the Y plane along the line X-X of FIG. 1.

The first capping layer 151 may be used to help keep the channel carriers within a thin layer underneath the gate resulting in improved electrostatic control of the gate. In a NMOS depletion-mode FinFET embodiment, this thin-channel may be accomplished by having a heavily p-type doped fin 150 in combination with either an undoped, lightly p-type doped, or lightly n-type doped capping layer 151 and heavily n-type doped source and drain regions. Conversely, in a PMOS depletion-mode FinFET embodiment, the thin-channel may be accomplished by having a heavily n-type doped fin 150 in combination with either an undoped, lightly n-type doped, or lightly p-type doped capping layer 151 and heavily p-type doped source and drain regions. In these embodiments, the band gap of the material forming capping layer 151 should be less than the band gap of the material forming the fin 150. This allows the channel carriers to stay within a thin layer underneath the gate defined by first capping layer 151. In addition, the first capping layer 151 may be used to help stabilize the nanometer scaled fin 150.

With reference to FIGS. 5A, 5B, and 5C, the first capping layer 151 is epitaxially grown on the exposed portion of the fin 150 by selective epitaxial growth (SEG). The first capping layer 151 may be formed of a semiconductor material same as, or a semiconductor material different from, that of fin 150. In an embodiment, the first capping layer 151 is formed of substantially pure silicon. In alternative embodiments, the first capping layer 151 may comprise silicon germanium (SiGe), silicon carbon (SiC), or the like. The formation methods of the first capping layer 151 may include atomic layer deposition (ALD), chemical vapor deposition (CVD), such as a reduced pressure CVD (RPCVD), metalorganic chemical vapor deposition (MOCVD), or other applicable methods. Depending on the desirable composition of the first capping layer 151, the precursors for the epitaxial may include Si-containing gases and Ge-containing gases, such as SiH4 and GeH4, and/or the like, and the partial pressures of the Si-containing gases and Ge-containing gases are adjusted to modify the atomic ratio of germanium to silicon. In an embodiment in which SiGe is desirable for forming the first capping layer 151, the resulting first capping layer 151 includes greater than 20 atomic percent germanium. The germanium percentage in the first capping layer 151 may also be between about 20 percent and about 50 atomic percent. The first capping layer 151 may be doped either through an implantation method as discussed above, or else by in-situ doping as the material is grown.

During the epitaxy process, etching gas, such as HCl gas, may be added (as an etching gas) into the process gas, so that the first capping layer 151 is selectively grown on fin 150, but not on substrate 110 as shown in FIGS. 5A and 5C. In alternative embodiments, no etching gas is added, or the amount of etching gas is small, so that there is a thin layer of the first capping layer 151 formed on the substrate 110. In yet another embodiment, substrate 110 could be covered with a sacrificial layer (not shown) to prevent epitaxial growth thereon.

Figure 6C:
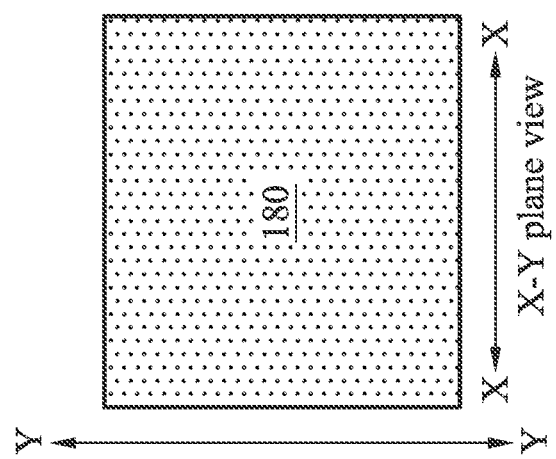
Figure 6B:
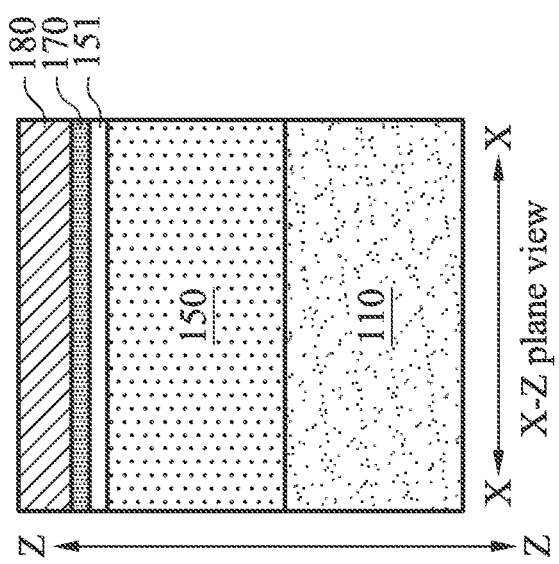
Figure 6A:
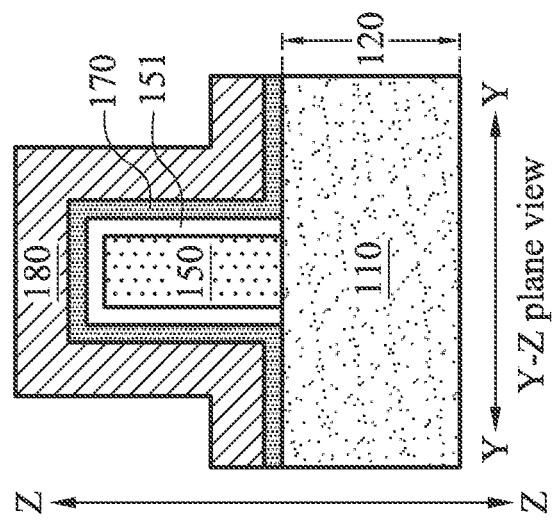

Step 28 is the formation of a gate dielectric layer and a gate electrode layer over the fin as shown in FIGS. 6A, 6B, and 6C. FIG. 6A is from the Z plane along the line Y-Y, FIG. 6B is from the Z plane along the line X-X, and FIG. 6C is from the Y plane along the line X-X of FIG. 1.

With reference to FIGS. 6A, 6B, and 6C, the gate dielectric layer 170 may be formed by thermal oxidation, CVD, sputtering, or any other methods known and used in the art for forming a gate dielectric. In other embodiments, the gate dielectric layer 170 includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, and the like, and combinations and multi-layers thereof. In another embodiment, the gate dielectric layer 170 may have a capping layer from metal nitride materials such as titanium nitride, tantalum nitride, or molybdenum nitride with a thickness from 1 nm to 20 nm.

After the gate dielectric layer 170 is formed, the gate electrode layer 180 may be formed. The gate electrode layer 180 comprises a conductive material and may be selected from a group comprising of polycrystalline-silicon (poly-Si), polycrystalline silicon-germanium (poly-SiGe), metallic nitrides, metallic silicides, metallic oxides, and metals. Examples of metallic nitrides include tungsten nitride, molybdenum nitride, titanium nitride, and tantalum nitride, or their combinations. Examples of metallic silicide include tungsten silicide, titanium silicide, cobalt silicide, nickel silicide, platinum silicide, erbium silicide, or their combinations. Examples of metallic oxides include ruthenium oxide, indium tin oxide, or their combinations. Examples of metal include tungsten, titanium, aluminum, copper, molybdenum, nickel, platinum, etc.

The gate electrode layer 180 may be deposited by CVD, sputter deposition, or other techniques known and used in the art for depositing conductive materials. The thickness of the gate electrode layer 180 may be in the range of about 200 angstroms to about 4,000 angstroms. The top surface of the gate electrode layer 401 usually has a non-planar top surface, and may be planarized prior to patterning of the gate electrode layer 180 or gate etch. Ions may or may not be introduced into the gate electrode layer 180 at this point. Ions may be introduced, for example, by ion implantation techniques.

Step 30 is the formation of a gate structure as shown in FIGS. 7A, 7B, and 7C. FIG. 7A is from the Z plane along the line Y-Y, FIG. 7B is from the Z plane along the line X-X, and FIG. 7C is from the Y plane along the line X-X of FIG. 1.

Referring to FIGS. 7A, 7B, and 7C, the gate electrode layer 180 and gate dielectric layer 170 are patterned to form a gate structure 200 and define a first section of the fin 230 (see FIG. 7C), a second section of the fin 231 (see FIG. 7C), and a channel region 205 (see FIG. 7B) located in the fin 150 underneath the gate dielectric 170. The gate structure 200 may be formed by depositing and patterning a gate mask (not shown) on the gate electrode layer 180 using, for example, deposition and photolithography techniques known in the art. The gate mask may incorporate commonly used masking materials, such as (but not limited to) photoresist material, silicon oxide, silicon oxynitride, and/or silicon nitride. The gate electrode layer 180 and the gate dielectric layer 170 may be etched using plasma etching to form the patterned gate structure 200 as illustrated in FIGS. 7B and 7C.

The first section of the fin 230 and the second section of the fin 231 may be doped by performing implanting process 220 to implant appropriate dopants to complement the dopants in the fin 150. For example, p-type dopants such as boron, gallium, indium, or the like may be implanted. Alternatively, n-type dopants such as phosphorous, arsenic, antimony, or the like may be implanted. The first section 230 and the second section 231 are implanted using the gate stack as a mask. In an embodiment, the dopant ions would be implanted at a level from $1e^{18}$ ions/cm$^3$ to $1e^{20}$ ions/cm$^3$.

Step 32 is the formation of the gate spacers as shown in FIGS. 8A, 8B, and 7C. FIG. 8A is from the Z plane along the line Y-Y, FIG. 8B is from the Z plane along the line X-X, and FIG. 8C is from the Y plane along the line X-X of FIG. 1.

With reference to FIGS. 8A, 8B, and 8C, the gate spacers 240 and 241 may be formed on opposite sides of the gate structure 200. The gate spacers 240 and 241 are typically formed by blanket depositing a spacer layer (not shown) on the previously formed structure. The spacer layer may comprise of SiN, oxynitride, SiC, SiON, oxide, and the like and may be formed by methods utilized to form such a layer, such as chemical vapor deposition (CVD), plasma enhanced CVD, sputter, and other methods known in the art. The gate spacers 240 and 241 are then patterned, preferably by anisotropically etching to remove the spacer layer from the horizontal surfaces of the structure. The gate spacers 240 and 241 may each have the same thickness 250 (see FIGS. 8B and 8C) which may range from 1.5 nm to 40 nm.

Figure 9C:
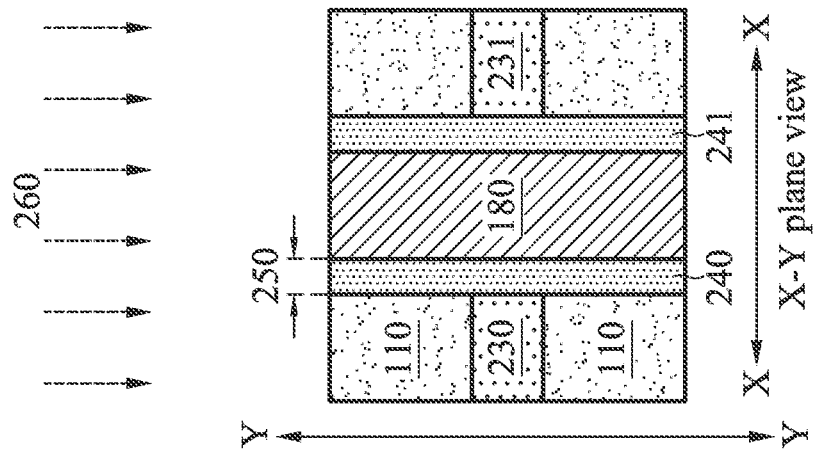
Figure 9B:
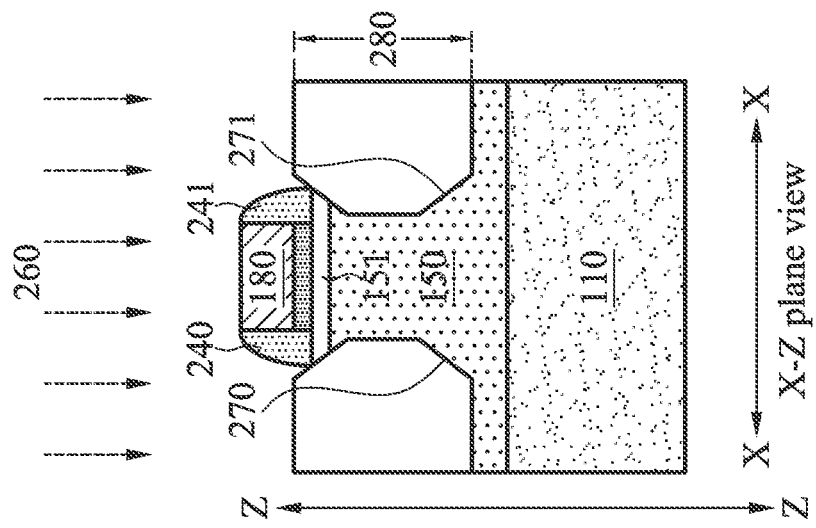
Figure 9A:
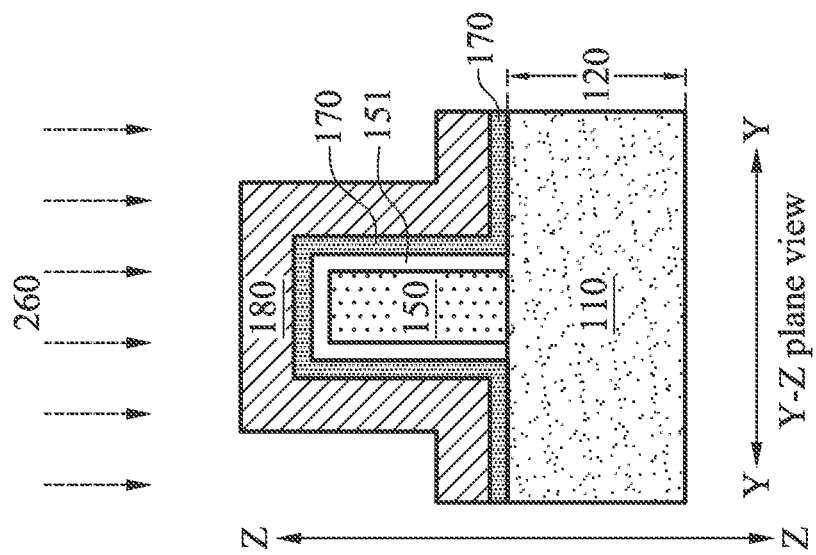

Step 34 is the formation of recesses into the fin for the source and drain structures as shown in FIGS. 9A, 9B, and 9C. FIG. 9A is from the Z plane along the line Y-Y, FIG. 9B is from the Z plane along the line X-X, and FIG. 9C is from the Y plane along the line X-X of FIG. 1.

Referring to FIGS. 9A, 9B, and 9C, first section 230 and second section 231 of fin 150 are removed or recessed forming source recess 270 and drain recess 271. In an embodiment, the source recess 270 and the drain recess 271 are formed by an isotropic orientation dependent etching process, wherein tetramethylammonium hydroxide (TMAH) may be used as an etchant. The source recess 270 and the drain recess 271 are formed with a depth 280 (see FIG. 9B) which may range from 0 nm to 150 nm.

Step 36 is the formation of the source and drain structures as shown in FIGS. 10A, 10B, and 10C. FIG. 10A is from the Z plane along the line Y-Y, FIG. 10B is from the Z plane along the line X-X, and FIG. 10C is from the Y plane along the line X-X of FIG. 1.

Referring to FIGS. 10A, 10B, 10C, an un-doped epitaxial layer 290 and 291 may be formed in the source recess 270 and the drain recess 271 respectively. The un-doped epitaxial layers 290 and 291 are to prevent leakage current between heavily doped epitaxial layers 300/301 and the fin 150. The undoped epitaxial layers 290 and 291 may be formed by SEG and the methods and materials discussed above in reference to first capping layer 151 in FIGS. 5A, 5B, and 5C.

After the un-doped epitaxial layers 290 and 291 are formed, the heavily doped epitaxial layers 300 and 301 are formed to complete the source structure 400 and drain structure 401. The heavily doped epitaxial layers 300 and 301 may be formed by SEG and the methods and materials discussed above in reference to first capping layer 151 in FIGS. 5A, 5B, and 5C. Heavily doped epitaxial layers 300 and 301 may be doped with p-type dopants or n-type dopants depending on the desired configuration of the FinFET device. In a NMOS embodiment, the n-type ions would be implanted at a level from $3e^{18}$ ions/cm$^3$ to $5e^{20}$ ions/cm$^3$. In a PMOS embodiment, the p-type ions would be implanted at a level from $3e^{18}$ ions/cm$^3$ to $5e^{20}$ ions/cm$^3$.

Returning to FIGS. 9A, 9B, 9C, in another embodiment the source structure 400 and drain structure 401 are formed so as to impart a strain on the channel layer formed by first capping layer 151. In this embodiment, the source structure 400 and the drain structure 401 may then be grown to form a stressor that will impart a stress on the channel layer formed by first capping layer 151 located underneath the gate structure 200. In an embodiment wherein the fin 150 comprises silicon, the source structure 400 and the drain structure 401 may then be formed through a SEG process with a material, such as silicon germanium, silicon carbon, or the like that has a different lattice constant than the silicon. The lattice mismatch between the stressor material in the source and drain structures 400 and 401 and the channel layer formed by first capping layer 151 will impart a stress into the channel layer that will increase the carrier mobility and the overall performance of the device. The source and drain structures 400 and 401 may be doped either through an implantation method as discussed above, or else by in-situ doping as the material is grown.

Figures 11A, 11B, 11C:
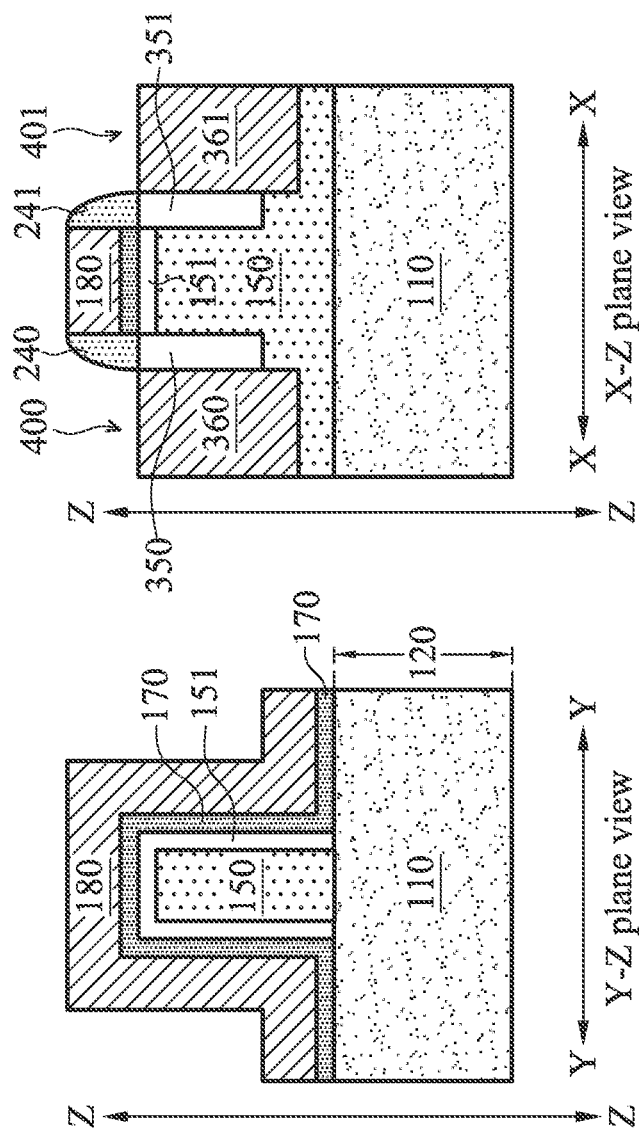

FIGS. 11A, 11B, and 11C illustrate cross-sectional views of another embodiment in which the source and drain structures comprise a lightly doped region and a heavily doped region, wherein FIG. 11A is from the Z plane along the line Y-Y, FIG. 11B is from the Z plane along the line X-X, and FIG. 11C is from the Y plane along the line X-X of FIG. 1.

In this embodiment, instead of forming the source structure 400 and the drain structure 401 by recessing portions of the fin 150 and epitaxially growing material in the recesses (see FIGS. 9A through 10C), the source structure 400 comprises of a first lightly doped region 350 and a first heavily doped region 360 and the drain structure 401 comprises of a second lightly doped region 351 and a second heavily doped region 361. As such, returning to FIGS. 7A, 7B, and 7C, after the gate structure 200 is formed; the first section of the fin 230 and the second section of the fin 231 are lightly doped by the implanting process 220 to implant appropriate dopants to complement the dopants in the fin 150. The dopant ions would be implanted at a level from $1e^{13}$ ions/cm$^3$ to $2e^{18}$ ions/cm$^3$. After the implanting process 220 is performed, the gate spacers 240 and 241 are formed (see FIGS. 8A, 8B, and 8C). After the gate spacers are formed, the first section of the fin 230 and the second section of the fin 231 are heavily doped by implanting doped ions at a level from $5e^{19}$ to $2e^{21}$. This forms a lightly doped regions 350 and 351 and heavily doped regions 360 and 361. The lightly doped regions are primarily underneath the gate spacers while the heavily dope regions are outside of the gate spacers along the fin 150.

Figure 12B:
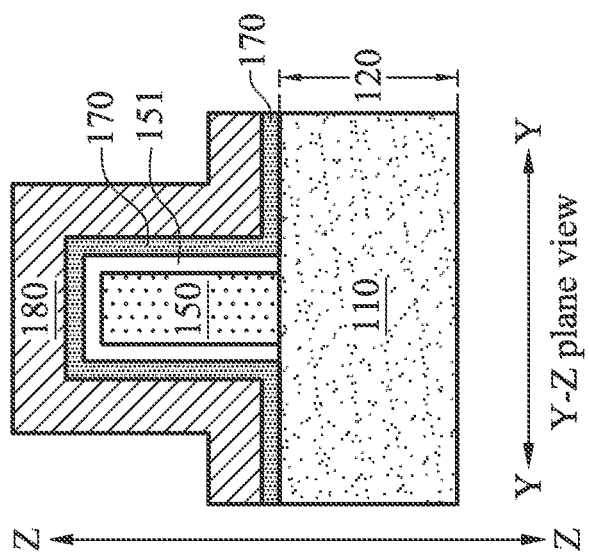
FIGS. 12A and 12B are cross-sectional views of depletion-mode FinFETs in accordance with an embodiment.
Figure 12A:
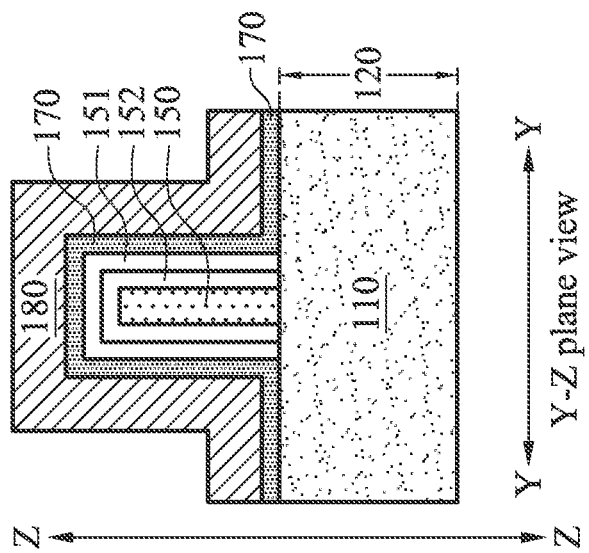

FIG. 12A illustrates a cross-sectional view of a NMOS depletion-mode FinFET embodiment, wherein FIG. 12A is from the Z plane along the line Y-Y. To form this embodiment, the fin 150 is heavily doped p-type (see above in reference to FIGS. 3A through 3C) and the source and drain structures 400 and 401 are heavily doped n-type (see above in reference to FIGS. 10A through 10C). The first capping layer 151 may be lightly doped n-type or p-type. This configuration with a n-type work function gate metal will function as a NMOS depletion-mode FinFET. The channel carriers will be repelled by the heavily p-type doped fin 150 and will stay within a thin layer underneath the gate defined by first capping layer 151. Alternatively, to form this embodiment as a PMOS depletion-mode FinFET, the fin 150 is heavily doped n-type and the source and drain structures 400 and 401 are heavily doped p-type. The first capping layer 151 may both be doped the same as in the NMOS configuration. This configuration with a p-type work function gate metal will function as a PMOS depletion-mode FinFET. The channel carriers will be repelled by the heavily n-type doped fin 150 and will stay within a thin layer underneath the gate defined by first capping layer 151. In both embodiments described, the capping layer may be implanted with either n-type ions or p-type ions at a level from $1e^{15}$ ions/cm$^3$ to $2e^{18}$ ions/cm$^3$ or not implanted with any ions at all.

FIG. 12B illustrates a cross-sectional view of another embodiment of a NMOS depletion-mode FinFET, wherein FIG. 12B is from the Z plane along the line Y-Y. This embodiment is similar to the embodiment in FIG. 12A, except instead of only having one capping layer (see FIG. 12A); this embodiment has a second capping layer 152 that is between the fin 150 and the first capping layer 151. This second capping layer 152 provides a diffusion barrier between the fin 150 and the capping layer 151. In an embodiment, the band gap of the material forming capping layer 151 may be less than, equal to, or greater than the band gap of the material forming the fin 150. This diffusion barrier allows the fin 150 to be forward biased to modulate the threshold voltage of the FinFET. Without the diffusion barrier, the fin 150 may only be reverse biased.

The second capping layer 152 is formed on the top surface and sidewalls of the fin 150 in an epitaxial process as discussed in reference to FIGS. 5A through 5C. After the second capping layer 152 is formed, the first capping layer 151 is epitaxially grown over the second capping layer 152. The second capping layer 152 is either doped heavily with carbon or is made from carrier-barrier materials such as SiGe for n-Si, AlGaAs for n-GaAs, and the like. If the second capping layer 152 is doped with carbon, it may be implanted with carbon ions at a level from $1e^{20}$ ions/cm$^3$ to $1e^{21}$ ions/cm$^3$. Alternatively, to form this embodiment as a PMOS depletion-mode FinFET, the fin 150 is heavily doped n-type and the source and drain structures 400 and 401 are heavily doped p-type. The first capping layer 151 and the second capping layer 152 may both be doped the same as they were in the NMOS configuration above, and when paired with a p-type work function gate metal will function as a PMOS depletion-mode FinFET. The channel carriers will be repelled by the heavily n-type doped fin 150 and will stay within a thin layer underneath the gate defined by first capping layer 151. In both embodiments described, the capping layer may be implanted with either n-type ions or p-type ions at a level from $1e^{15}$ ions/cm$^3$ to $2e^{18}$ ions/cm$^3$ or not implanted with any ions at all.

The embodiments of FIGS. 12A and 12B both achieve a thin-channel underneath the gate. This thin-channel allows for improved electrostatic control of the gate. The fin 150 can also be biased through the substrate 110 allowing the modulation of the threshold voltage of the FinFET. The ability to modulate the threshold voltage allows for this FinFET to be used in ultra-low, low, and standard voltage designs.

Figure 13A:
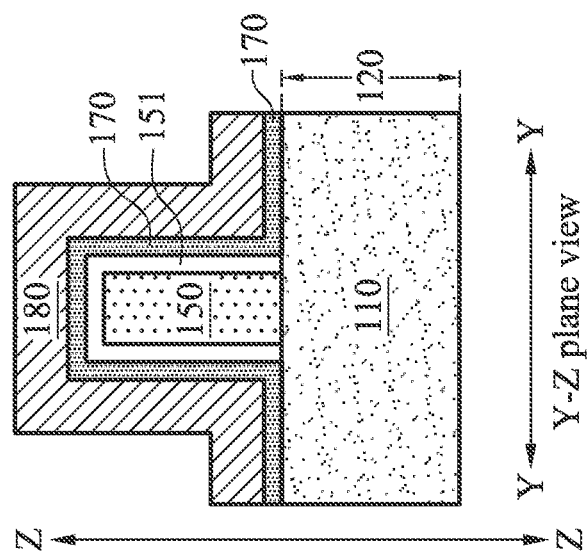
FIGS. 13A through 13D are cross-sectional views of accumulation-mode FinFETs in accordance with an embodiment.

FIG. 13A illustrates a cross-sectional view of a NMOS accumulation-mode FinFET embodiment, wherein FIG. 13A is from the Z plane along the line Y-Y. In this embodiment the fin 150 may be implanted with p-type ions at a level from $3e^{18}$ ions/cm$^3$ to $5e^{18}$ ions/cm$^3$. The first capping layer 151 is formed as discussed above with reference to FIGS. 5A through 5C. In this embodiment, the capping layer may be implanted with n-type ions at a level from $3e^{18}$ ions/cm$^3$ to $5e^{20}$ ions/cm$^3$. This configuration with a p-type work function gate metal gate will function as a NMOS accumulation-mode FinFET.

Figure 13B:
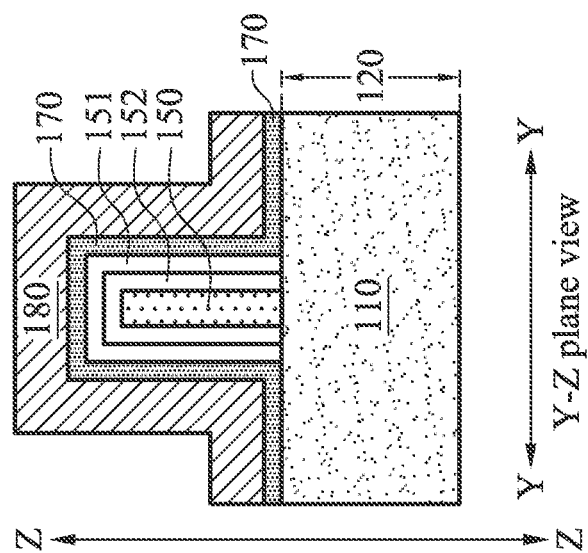

FIG. 13B illustrates a cross-sectional view of another embodiment of a NMOS accumulation-mode FinFET, wherein FIG. 13B is from the Z plane along the line Y-Y. Instead of only having one capping layer (see FIG. 13A); this embodiment has a second capping layer 152. This second capping layer 152 is formed as a diffusion barrier between the fin 150 and the capping layer 151 as discussed above in reference to FIG. 12B. The second capping layer 152 is either doped heavily with carbon or is made from carrier-barrier materials such as SiGe for n-Si, AlGaAs for n-GaAs, and the like. If the second capping layer 152 is doped with carbon, it may be implanted with carbon ions at a level from $1e^{20}$ ions/cm$^3$ to $1e^{21}$ ions/cm$^3$. The first capping layer 151 is formed as discussed above with reference to FIGS. 5A through 5C. In this embodiment, the first capping layer 151 may be implanted with n-type ions at a level from $3e^{18}$ ions/cm$^3$ to $5e^{20}$ ions/cm$^3$. This configuration with a p-type work function gate metal gate will function as a NMOS accumulation-mode FinFET.

Figure 13C:
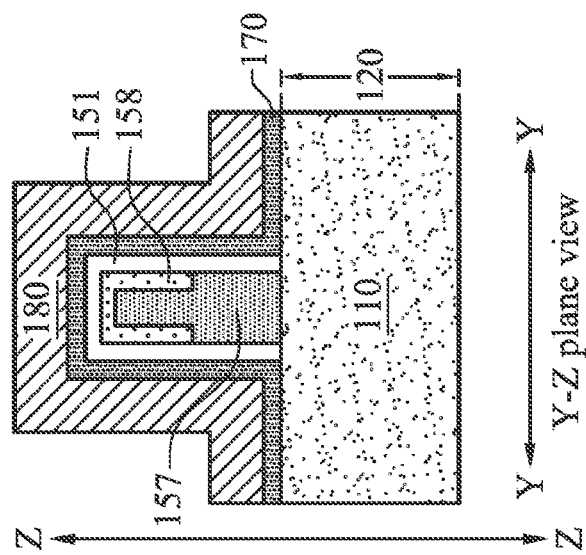

FIG. 13C illustrates a cross-sectional view of yet another embodiment of a NMOS accumulation-mode FinFET, wherein FIG. 13C is from the Z plane along the line Y-Y. Instead of having a uniformly doped fin (see FIG. 13B); in this embodiment the fin 150 has an inner section 157 and an outer section 158. The fin 150 is initially formed and doped in the same way as described in reference to FIGS. 3A through 4C. To dope the outer section 158, the fin 150 undergoes plasma immersion ion implantation (PIII) process to form the thin layer of the fin that comprises the outer section 158. The outer section 158 may be lightly doped n-type or p-type at a level from $1e^{13}$ ions/cm$^3$ to $5e^{17}$ ions/cm$^3$. A second capping layer 152 is formed as a diffusion barrier between the fin 150 and the capping layer 151 as discussed above in reference to FIG. 12B. The second capping layer 152 is either doped heavily with carbon or is made from carrier-barrier materials such as SiGe for n-Si, AlGaAs for n-GaAs, and the like. If the second capping layer 152 is doped with carbon, it may be implanted with carbon ions at a level from $1e^{20}$ ions/cm$^3$ to $1e^{21}$ ions/cm$^3$. The first capping layer 151 is formed as discussed above with reference to FIGS. 5A through 5C. In this embodiment, the first capping layer 151 may be implanted with n-type ions at a level from $3e^{18}$ ions/cm$^3$ to $5e^{20}$ ions/cm$^3$. The lightly doped outer section 158 in combination with the second capping layer 152 as a diffusion barrier helps to confine the channel carriers in the first capping layer 151. This configuration with a p-type work function gate metal gate will function as a NMOS accumulation-mode FinFET.

Figure 13D:
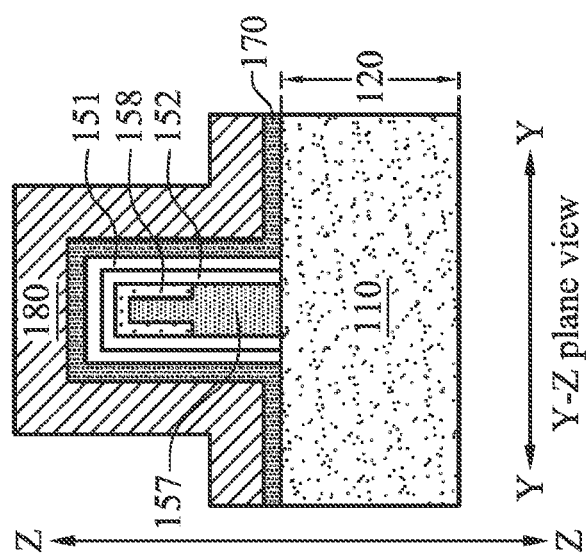

FIG. 13D illustrates a cross-sectional view of another embodiment of a NMOS accumulation-mode FinFET, wherein FIG. 13D is from the Z plane along the line Y-Y. Instead of a fin with an inner and outer section surrounded by first and second capping layer (see FIG. 13C); in this embodiment the outer section 158 is heavily doped with carbon and is surrounded only by the first capping layer 151. The outer section 158 that is heavily doped with carbon provides a diffusion barrier (as described in reference to FIG. 12B), but without the need for the second capping layer. The first capping layer 151 is formed as discussed above with reference to FIGS. 5A through 5C. In this embodiment, the first capping layer 151 may be implanted with n-type ions at a level from $3e^{18}$ ions/cm$^3$ to $5e^{20}$ ions/cm$^3$. This configuration with a p-type work function gate metal gate will function as a NMOS accumulation-mode FinFET.

Although the present embodiments and their advantages have been described in detail, it should be understood that various changes, substitutions and alterations can be made herein without departing from the spirit and scope of the disclosure as defined by the appended claims. For example, there are multiple methods for the deposition of material as the structure is being formed. Any of these deposition methods that achieve substantially the same result as the corresponding embodiments described herein may be utilized according to the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
    forming a semiconductor fin on a top surface of a substrate;
    forming a diffusion barrier layer on a top surface and sidewalls of the semiconductor fin, the diffusion barrier layer comprising a carbon-containing material; and
    forming a capping layer on a top surface and sidewalls of the diffusion barrier layer, the capping layer having a band gap less than a band gap of the semiconductor fin, the diffusion barrier layer having a material composition different than material compositions of both the semiconductor fin and the capping layer.

2. The method of claim 1, wherein the forming the capping layer comprises epitaxially growing the capping layer.

3. The method of claim 2, wherein the epitaxially growing the capping layer comprises a selective epitaxial growth process.

4. The method of claim 1, wherein the forming the diffusion barrier layer further comprises epitaxially growing the diffusion barrier layer on the top surface and sidewalls of the semiconductor fin, wherein the forming the capping layer comprises epitaxially growing the capping layer on the top surface and sidewalls of the diffusion barrier layer.

5. The method of claim 1, wherein the forming of the semiconductor fin further comprises plasma implanting dopants to a first concentration in the semiconductor fin and to a second concentration in the capping layer, the first concentration being a higher concentration than the second concentration.

6. The method of claim 1, wherein the capping layer comprises substantially pure silicon, SiGe, SiC, or a combination thereof.

7. The method of claim 1 further comprising:
    forming a gate dielectric layer on a top surface and sidewalls of the capping layer; and
    forming a gate electrode on a top surface and sidewalls of the gate dielectric layer.

8. The method of claim 7 further comprising:
    forming a source region and a drain region in the semiconductor fin, the gate electrode being interposed between the source region and the drain region.

9. The method of claim 1, wherein the diffusion barrier layer has a band gap greater than the band gap of the semiconductor fin.

10. A method of forming a fin field-effect transistor (FinFET), the method comprising:
    forming a fin raised above a substrate, the forming the fin further comprising:
        forming an inner section of the fin having a first band gap;
        forming a middle section of the fin on the inner section of the fin, the middle section having a second band gap, the second band gap being greater than the first band gap; and
        forming an outer section of the fin on the middle section of the fin, the outer section having a third band gap, the third band gap being less than the first band gap.

11. The method of claim 10, wherein the forming the outer section comprises epitaxially growing the outer section.

12. The method of claim 10, wherein the forming the middle section further comprises epitaxially growing the middle section on a top surface and sidewalls of the fin, wherein the forming the outer section comprises epitaxially growing the outer section on a top surface and sidewalls of the middle section.

13. The method of claim 10, wherein the forming of the fin further comprises plasma implanting dopants to a first concentration in an inner section of the fin and to a second concentration in the outer section of the fin, the first concentration being a higher concentration than the second concentration.

14. The method of claim 10, wherein the middle section comprises a carbon-containing material.

15. The method of claim 10, wherein the forming the middle section of the fin comprises performing a plasma immersion ion implantation process.

16. The method of claim 10, wherein the forming the inner section of the fin having the first band gap further comprises:
    forming a first inner section of the fin having the first band gap; and
    implanting the first inner section of fin with dopants to form a second inner section in a top surface and sidewalls of the first inner section, the middle section being formed on the second inner section.

17. A method comprising:
    forming a fin above a substrate, the fin being doped to a first concentration;
    epitaxially growing a diffusion barrier layer on a top surface and sidewalls of the fin, the diffusion barrier layer having a band gap greater than a band gap of the fin; and
    epitaxially growing a capping layer on a top surface and sidewalls of the diffusion barrier layer, the capping layer being doped to a second concentration, the second concentration being less than the first concentration.

18. The method of claim 17 further comprising:
    forming a gate dielectric layer on a top surface and sidewalls of the capping layer;
    forming a gate electrode on a top surface and sidewalls of the gate dielectric layer; and
    forming a source region and a drain region in the fin, the gate electrode being interposed between the source region and the drain region.

19. The method of claim 17, wherein the capping layer has a band gap less than the band gap of the fin.

20. The method of claim 17, wherein the diffusion barrier layer has a material composition different than material compositions of both the fin and the capping layer.

* * * * *